United States Patent [19]

Franklin

[11] Patent Number: 4,461,025
[45] Date of Patent: Jul. 17, 1984

[54] AUTOMATIC BACKGROUND NOISE SUPPRESSOR

[75] Inventor: David Franklin, Somerville, Mass.

[73] Assignee: Audiological Engineering Corporation, Somerville, Mass.

[21] Appl. No.: 390,840

[22] Filed: Jun. 22, 1982

[51] Int. Cl.$^3$ .............................................. H04B 1/10
[52] U.S. Cl. ........................................ 381/56; 381/94; 381/107; 455/219
[58] Field of Search ............... 455/219, 221, 222, 225, 455/312; 381/56, 57, 71, 94, 107

[56] References Cited

U.S. PATENT DOCUMENTS

| | | | |
|---|---|---|---|
| 3,102,236 | 8/1963 | Eichenberger et al. | 455/225 X |
| 4,143,325 | 3/1979 | Kahn | 455/221 X |
| 4,216,430 | 8/1980 | Amazawa et al. | 455/219 |

Primary Examiner—Harold I. Pitts
Assistant Examiner—James L. Dwyer
Attorney, Agent, or Firm—Epstein & Edell

[57] ABSTRACT

A circuit for suppressing background noise of a continuous nature while enhancing speech signals, or signals having the transient temporal qualities of speech, includes a signal multiplier which, in the preferred embodiment, receives the composite audio signal along with a control signal present only when the speech component of the audio signal is present. The control signal may be derived from an AGC circuit having a slow attack, fast decay characteristic to establish a quiescent output level from the AGC amplifier in the absence of speech. An envelope detector is biased to provide a zero output amplitude in response to the quiescent amplifier output level. Speech components appearing in the amplifier output signal are then envelope-detected and filtered to provide the control signal. Alternatively, the control signal can be derived by envelope-detecting the audio signal, filtering the detected signal to remove its d.c. component representing the continuous noise, and then detecting and filtering again. In still another embodiment, the control signal acts upon a constant amplitude instead of the audio input signal in order to provide a speech-responsive tactile vibration for the deaf.

21 Claims, 9 Drawing Figures

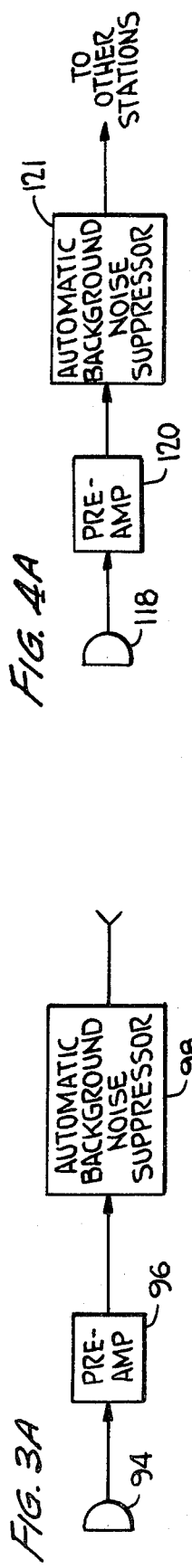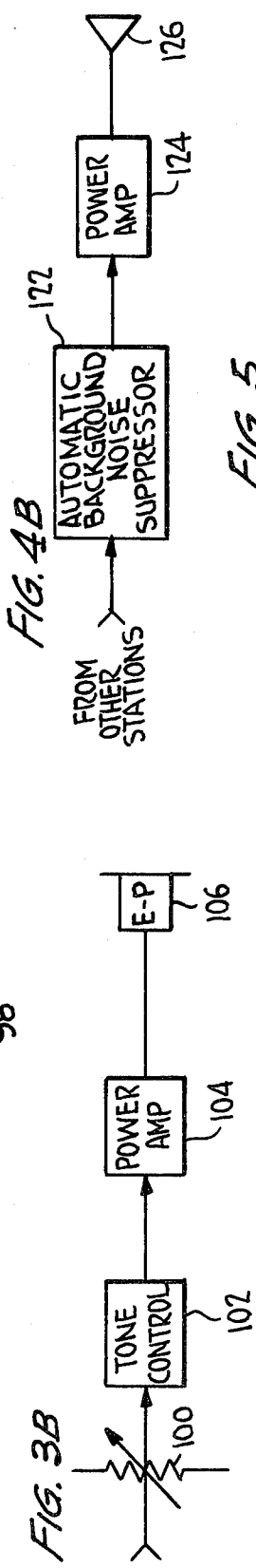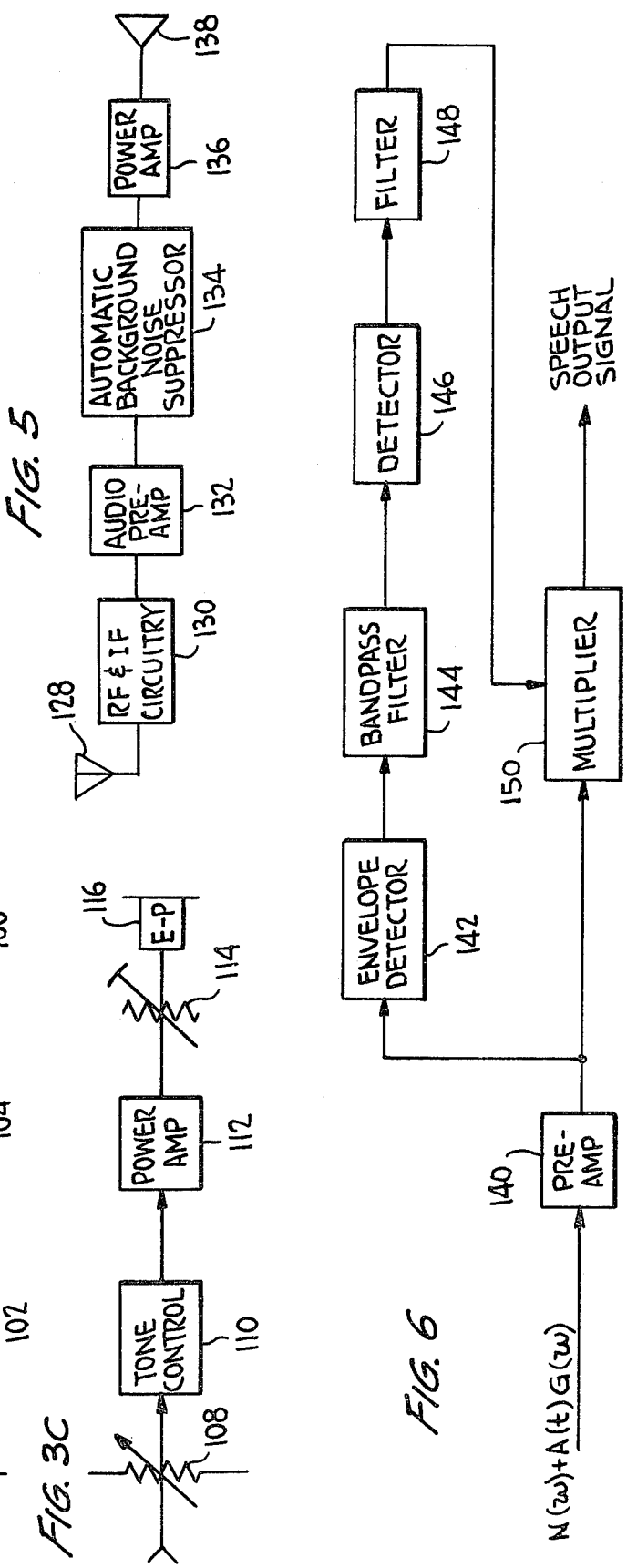

AUTOMATIC BACKGROUND NOISE SUPPRESSOR

BACKGROUND OF THE INVENTION

1. Technical Field

The present invention relates to the suppression of background noise in order to separate speech and speech-like signals from a composite audio signal.

2. Description of the Prior Art

There are certain classes of background noise which accompany speech in audio communication systems that are designed primarily to transmit speech. Such background noises include the sound of forced air from an air conditioning system, motors, other mechanical contrivances, the babble of background voices in a crowd, and hiss or white noise. All of these different types of noises exhibit certain temporal properties which distinguish them significantly from the temporal properties of speech emanating from a single talker.

Before describing the differences in temporal properties between the speech and accompanying noise, it is important to distinguish the main purpose of this invention from other types of common noise-suppression systems, such as: squelch systems, in which the primary purpose is to remove channel noise caused by a low signal-to-noise ratio resulting from a weak or non-existent radio frequency carrier; expansion/compression systems, such as the DBX and the Dolby expander/compressor; and noise pulse eliminator circuits of various design. In the case of conventional squelch systems, the essential problem is to recognize when the radio frequency input signal applied to a receiver contains useful information as opposed to when it contains merely noise. It is usual to either manually or automatically set a threshold such that when useful information is present in the derived audio channel, a gate is operated to transfer the information to an output line; on the other hand, in the presence of a poor signal-to-noise condition, the gate opens and "squelches" the output signal. Importantly, such conventional squelch systems operate to determine that the radio frequency signal being received has a high signal-to-noise ratio, but do not examine the content of the radio frequency signal to determine if the content of the signal is speech or engine noise. The present invention, on the other hand, specifically determines what the content of the derived audio signal is and, in the preferred embodiment described herein, suppresses noises, such as engine noise, while retaining the speech signal. Examples of conventional radio frequency squelch systems may be found in U.S. Pat. Nos. 4,038,604 (Koerber), 3,660,765 (Glasser et al), 3,628,058 (Espe), and 4,158,174 (Gruenberger et al).

In the case of the expander/compressor systems, such as the Dolby or DBX systems, emphasis is placed on examining and adjusting relative amplitudes of the different constituents of the audio signals, the ultimate goal being the decrease in background noise. No distinction is made in such systems between sustained sounds, such as a lengthy drum roll, and transient sounds, such as a spoken phrase. Instead, distinctions are made on the basis of relative intensities occurring within the resultant complex wave forms. The present invention, on the other hand, is specifically directed to distinguishing between sustained and non-sustained qualities of sounds so that a drum roll would be defined as noise while a spoken phrase would be classified as a desired signal.

In noise pulse eliminator arrangements of the prior art, there is an attempt to examine the statistics of given wave forms, whether they be related to radio frequency transmission systems or recording systems. However, the nature of the statistical analysis performed in noise pulse eliminators differs greatly from the nature of the statistical analysis performed in the present invention. While noise pulse eliminators are designed to delete rapid burst-type signals, the present invention is specifically designed to eliminate longsustained sounds. Of necessity, the difference in emphasis results in a difference in methods and apparatus employed to achieve the desired results of the present invention.

From the foregoing, it will be appreciated that the present invention is intended to suppress background noise in speech communication systems, such as hearing aids, intercom systems, public address systems, etc. In addition, the principles of the present invention are useful in systems for producing tactile stimulation to aid the deaf or nearly deaf in perceiving speech. More specifically, the present invention is useful in providing vibro-tactile stimulation as a function of speech. The utility of such stimulation is described in a paper entitled "Tactile Stimulation in Speech Reception: Experience With a Non-Auditory Child" by Goldstein et al published by A. G. Bell Association, 1981, and presented as a paper at the Conference on the Speech of the Hearing Impaired at the Graduate School and University Center of the City University of New York, Oct. 31–Nov. 2, 1979.

SUMMARY AND OBJECTS OF THE INVENTION

It is, therefore, a primary object of the present invention to provide a method and apparatus for automatically suppressing an audio signal in the absence of desired speech or speech-like components and increasing the overall system gain when speech or speech-like signal components are present. The method and apparatus are unique in that the wave form which is examined in order to determine if the desired speech component is present is the composite audio signal itself and not the radio frequency or intermediate frequency carrier signal from which the composite audio signal may have been derived. For this purpose, "noise" or unwanted signal is defined to be any sustained wave form whereas the desired signal is defined to be any non-sustained wave form, such as wave forms which are characteristic of speech signals. The parameter employed to distinguish between background noise, on the one hand, and the desired speech signal, on the other hand, is the presence or absence of zero energy (or nearly zero energy) time intervals in the short-term power spectra of the respective classes of signals for given integration times. In other words, for speech signals employing integration times on the order of 20 to 100 milliseconds, short-term power spectra with distinct energy time intervals are obtained. On the other hand, for the same integration times, the power spectra obtained from sustained background noise signals contain few, if any, such zero energy intervals. It should be noted that successful exploitation of this distinction in short-term power spectra extends to the case where some zero energy intervals occur in the background noise; however, these must be of extremely short duration as compared to the duration of zero energy intervals in the speech signal.

In accordance with the present invention, the speech signal is enhanced by providing a control signal that is only present when a speech component is present in the composite audio input signal. This control signal is applied to a signal multiplier which, in a preferred embodiment of the present invention, receives the composite audio input signal as its second input signal. Since the multiplier output signal is zero in the absence of signal energy from either of its two input signals, the presence of the control signal only during speech intervals results in a multiplied amplitude of only the speech portions of the composite input signal. In a second embodiment, the second signal applied to the multiplier is an audio tone which, when multiplied by the control signal, provides a signal suitable for activating a vibrator to provide speech-responsive tactile stimulation for the deaf or nearly deaf.

In the preferred embodiment, the control signal is derived with a three-part circuit. First, a unique slow-attack, fast-release automatic gain control (AGC) circuit is employed to provide an AGC amplifier output signal having a known constant value when the circuit is excited by background noise alone, regardless of the magnitude of the noise signal, as long as the magnitude is above some predetermined threshold value. Second, a biased detector circuit receives the AGC amplifier output signal and is biased itself to provide a zero output signal when it is excited by the quiescent or constant steady state amplitude produced when the circuit is excited by noise alone. Third, a filter is arranged to receive its input signal from the biased detector and provide the control signal as its output signal. In addition, a fast-attack, slow-release AGC circuit may be connected in parallel with the slow-attack, fast-release AGC circuit to control the circuit gain so as to limit the normal speech signal amplitude and to rapidly drive the AGC circuitry to its steady state condition. Both AGC circuits are of the type that do not operate at all until certain predetermined signal levels are reached. At that point, sufficient gain is designed into the control loops such that further increase in input signal levels do not change the output signal level.

In another embodiment of the present invention, the control signal is derived by envelope-detecting the composite audio signal such that the constant amplitude noise is detected as a d.c. voltage and the speech component is detected as an audio signal. The detected signal is passed through a band pass filter having a low frequency cutoff which is above zero Hz so that the d.c. component contributed by the noise is blocked. The detected audio which is passed by the band pass filter is passed through another detector and filter to the multiplier as a control signal.

It is another object of the present invention to provide a method and apparatus for distinguishing between signals having time intervals with zero or nearly zero energy therein and signals which are substantially continuous for the purpose of suppressing the continuous signal and enhancing the signal having time intervals with zero energy.

It is a further object of the present invention to provide a method and apparatus for enhancing signal components having the temporal qualities of speech while suppressing substantially continuous signal components in a composite audio signal.

BRIEF DESCRIPTION OF THE DRAWINGS

The above and still further objects, features and advantages of the present invention will become apparent upon consideration of the following detailed description of specific embodiments thereof, especially when taken in conjunction with the accompanying drawings, wherein:

FIGS. 3A, 3B and 3C constitute a schematic diagram of a hearing aid system employing the automatic background noise suppressor of the present invention wherein FIG. 3A illustrates the microphone pickup and its connection to the background noise suppressor, FIG. 3B illustrates the volume and tone control portion as it connects to the earphone, and FIG. 3C is an alternaive embodiment of the circuit of FIG. 3B;

FIGS. 4A and 4B constitute a schematic diagram of an intercom system employing the automatic background noise suppressor of the present invention wherein the transmitter portion is illustrated in FIG. 4A and the receiver portion is illustrated in FIG. 4B;

FIG. 5 is a schematic diagram of a radio frequency receiver employing the automatic background noise suppressor of the present invention in place of a conventional squelch circuit; and FIG. 6 is an alternative embodiment of the automatic background noise suppressor circuit of the present invention.

DESCRIPTION OF THE PREFERRED EMBODIMENTS

Figure 1:
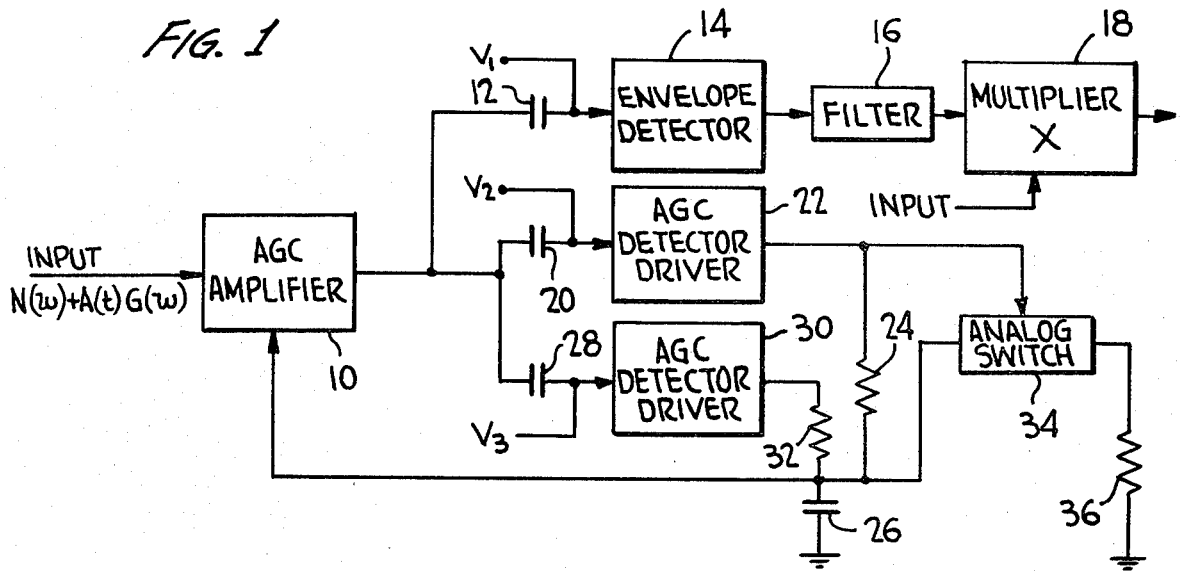
FIG. 1 is a schematic diagram of a preferred embodiment of the automaic background noise suppressor system of the present invention.

Referring specifically to FIG. 1 of the accompanying drawings, a preferred embodiment of the present invention includes an automatic gain control (AGC) amplifier 10 which receives as an input signal a signal generally designated by $N(\omega)+A(t)\cdot G(\omega)$. This signal represents a composite audio signal wherein the component $N(\omega)$ is a constant amplitude background noise component and wherein the $A(t)\cdot G(\omega)$ component is a speech wave form in which $A(t)$ is the speech envelope and $G(\omega)$ is the spectral distribution function of the speech wave form. The output signal from the AGC amplifier 10 is applied through a coupling capacitor 12 to an envelope detector 14. Also applied to envelope detector 14 is a d.c. bias voltage $V_1$ which determines the minimum amplitude for the output signal of AGC amplifier 10 which is necessary to cause a non-zero output signal from the envelope detector 14. Bias voltage $V_1$ is selected such that when the $N(\omega)$ component of the composite audio input signal is large and the speech component is set to zero, the output signal from envelope detector 14 is at a predetermined threshold level, typically just barely 0 volts amplitude, after the steady state or quiescent gain condition of amplifier 10 has been achieved. The output signal from AGC amplifier 10 is also applied through a coupling capacitor 20 to an AGC detector driver circuit 22 and through another coupling capacitor 28 to an AGC detector driver circuit 30. The AGC detector driver circuit 22 also receives a d.c. bias voltage $V_2$ which determines when the AGC control loop associated with detector 20 is actuated. The AGC detector driver circuit 30 receives a bias voltage $V_3$ which determines when the AGC loop controlled by that driver circuit is active. In other words, the bias voltages $V_2$ and $V_3$ are threshold voltages which determine when the AGC detector driver circuits 22 and 30 provide d.c. output signals in response to the output signal provided by the AGC amplifier 10.

The output signal from the AGC detector driver circuit 22 is employed to charge a storage capacitor 26 through a resistor 24. Similarly, the output signal from AGC detector driver circuit 30 is employed to charge capacitor 26 through another resistor 32. The storage capacitor 26 is provided with a discharge path comprising resistor 36, the discharge path being controlled by an analog switch 34. Analog switch 34 is gated off by the output signal from the AGC detector driver circuit 22 whenever the storage capacitor 26 is being charged via resistor 24. The voltage appearing across the storage capacitor 26 is employed to control the gain of AGC amplifier 10.

The output signal from the envelope detector 14 is applied via filter 16 to a multiplier 18. According to a preferred embodiment of the present invention, the second input signal applied to the multiplier circuit 18 the same composite audio input signal applied to the AGC amplifier 10.

The automatic gain control loop which includes AGC detector driver circuit 22, resistor 24 and capacitor 26 differs from the usual fast-attack, slow-release type of automatic gain control; rather, the control provided by this portion of the circuit has a slow-attack, fast-release characteristic. To accomplish this, the resistance of resistor 24 is selected to be a relatively high resistance value. For example, the time constant of the RC circuit including resistor 24 and capacitor 26 ranges in the order from 10 seconds to 100 seconds, depending upon the gain control characteristics of the gain control element in AGC amplifier 10. As a consequence, the speech component, $A(t) \cdot G(\omega)$, with its relatively transient nature, does not significantly affect gain control through this loop. On the other hand, the relatively constant amplitude background noise produces a d.c. voltage at the output terminal of AGC detector driver 22 which causes storage capacitor 26 to slowly charge. Primary automatic gain control is thereby achieved in response to a background noise component alone appearing in the input signal applied to the AGC amplifier 10. The resulting output signal from AGC amplifier 10, resulting solely from the constant background noise as controlled by elements 22, 24 and 26, provides the quiescent signal level which is applied to the envelope detector 14. The bias voltage $V_1$ is selected to match this quiescent value so that the output from the envelope detector, in response to the quiescent voltage level, is substantially zero.

The time constant provided by resistor 32 and capacitor 26 is considerably faster than that provided by the resistor 24 and capacitor 26 and is typically on the order of 1 millisecond to 20 milliseconds. Automaic gain control via elements 30, 32 and 36 is, therefore, achieved by means of this fast-attack loop in the conventional way when the speech wave form is of sufficient magnitude.

The function of discharge resistor 36 is to provide a discharge path for storage capacitor 26. Analog switch 34 serves to disconnect the discharge resistor 36 from storage capacitor 26 whenever the slow-attack AGC detector driver 22 provides charging current through resistor 24 to capacitor 26. If the analog switch 34 were not present, the relatively low resistance of discharge resistor 36 would prevent the charge on capacitor 26 from rising above ground. The resistance value of discharge resistor 36 is selected such that the time constant formed by resistor 36 and storage capacitor 26 is approximately 50 to 100 milliseconds. The function of the discharge circuit is to permit any contributions made by the speech component of the input signal to the charge on capacitor 26 to decay and not be part of the control of AGC amplifier 10 in the steady state. Since the analog switch 34 disconnects the discharge resistor 36 from the storage capacitor 26 whenever the slow-attack AGC resistor 24 is passing current, this function and purpose of the analog switch is clearly achieved.

A better understanding of system operation may be provided by first considering the circuit of FIG. 1 with only a background noise component $N(\omega)$ appearing at the input terminal of AGC amplifier 10. This substantially constant amplitude background noise component is amplified by amplifier 10 and applied via respective coupling capacitors 20, 28 to the respective AGC detector driver circuits 22, 30. The signal is also applied via coupling capacitor 12 to envelope detector 14. It is assumed that the magnitude of the signal provided by AGC amplifier 10 exceeds the bias voltage $V_3$. It should be noted that bias voltage $V_3$ is always chosen to be greater than the bias voltage $V_2$ so that the slow-attack AGC loop will always begin to charge capacitor 26 at a lower output voltage from AGC amplifier 10 than would be the case for the fast-attack loop which includes AGC detector driver circuit 30. Since the assumed output voltage from AGC amplifier 10 exceeds both bias voltages $V_2$ and $V_3$, both of the AGC control loops begin to charge capacitor 26. The fast-attack loop components, including detector driver 30 and resistor 32, cause the voltage across capacitor 26 to increase rapidly, thereby decreasing the gain of AGC amplifier 10 until the signal magnitude at the output of AGC amplifier 10 is substantially equal to the bias voltage $V_3$. If no signal other than the noise component $N(\omega)$ is present at the input, the slow-attack AGC loop components, including detector driver 22 and resistor 24, continue to charge capacitor 26 for the duration of one time constant. After this time constant, corresponding to the product of the resistance of resistor 24 and the capacitance of capacitor 26, a steady state condition is achieved. As previously noted, the bias voltage $V_1$ for envelope detector 14 is selected such that the magnitude of the steady state or quiescent voltage from AGC amplifier 10 substantially equals bias voltage $V_1$. Therefore, the output signal from the envelope detector 14 is substantially zero at this steady state or quiescent condition. Regressing for a moment, consider storage capacitor 26 uncharged and that a composite input signal, including both the noise and speech components, is applied to AGC amplifier 10. If this signal is sufficiently large so as to exceed the bias voltage $V_3$, it causes the fast-attack loop components 30, 32 to override the slow-attack loop components 22 and 24 to more rapidly charge capacitor 26 to its steady state or quiescent condition voltage. The fast-attack loop components thereby avoid the delay in reaching the steady state or quiescent condition which would otherwise be the case if only the slow-attack AGC components were employed. This rapid charging of capacitor 26 and quick attainment of the quiescent condition can be accomplished, in practice, by merely talking into the microphone or other audio transducer which serves as the input to the system.

Assume now that the steady state or quiescent condition has been attained. Any speech signal of the general form $A(t) \cdot G(\omega)$ can be added to the previously assumed noise component $N(\omega)$. The contribution from the speech component provides a non-zero output voltage from envelope detector 14 which is filtered by filter 16 to provide a signal of the general form H(t). The specific nature of this signal depends upon the characteristics of filter 16 which is described in greater detail below. It should be noted that if the signal appearing at the output of AGC amplifier 10 has a voltage which is less than the value necessary to activate the fast-attack AGC loop (i.e. less than bias voltage $V_3$), then the gain of amplifier 10 remains constant. If, however, the output signal from amplifier 10 is larger than bias voltage $V_3$, then the gain of amplifier 10 rapidly decreases so that the normal AGC control remains intact. Once the assumed large signal vanishes, the combination of analog switch 34, as controlled by the voltage from AGC detector driver circuit 22, and the discharge resistor 36, restores the gain of amplifier 10 to the previously attained quiescent or steady state condition by causing capacitor 26 to discharge through resistor 36.

The input signals to the multiplier circuit 18 are signal H(t) from filter 16 and the composite audio input signal which is also applied to the input terminal of AGC amplifier 10. It should be noted in passing that some other signal than the composite audio input signal can be provided as the second input to multiplier circuit 18; examples of such other signals are described hereinbelow. The output signal from multiplier circuit 18 takes the form of $H(t)[N(\omega)+A(t) \cdot G(\omega)]$. It will be noted that this signal form is similar to that of a conventional squelch system output signal except that the step function multiplier commonly employed in squelch systems is replaced by the envelope detected and filtered signal H(t).

Since the output signal of the envelope detector 14 is substantially zero whenever the speech component is not present in the input signal, the output signal from multiplier circuit 18 is also zero whenever there is no speech component present in the composite audio input signal. On the other hand, whenever there is a speech component present in the composite audio input signal, the amplitude of the composite audio input speech, as applied to multiplier circuit 18, is multiplied by the output signal H(t) from filter 16. The audio component is thereby enhanced by multiplier 18 whereas the background noise appearing in the composite audio signal is suppressed.

For certain applications, it may be desirable to exactly reproduce the form of the speech signal in a form which is as little perturbed as possible. In such cases, the signal H(t) would be implemented as a step function, possibly with hysteresis and with a slow release for purposes of smoothing the state change following the end of speech in the channel. In such cases, the filter 16 would actually take the form of a voltage comparator with associated hysteresis and/or appropriate decay characteristics. More often, as in the case with the preferred embodiment of the present invention, a function which approximates the speech envelope is what is desired. In this case, filter 16 takes the form of a low pass filter having a band width and response commensurate with the speech envelope. With such a filter employed, the resultant output from multiplier circuit 18 is similar to that obtained using an amplitude expander. The advantage of this approach resides in the improved signal-to-noise ratio achieved during speech and which is characteristic of such systems. A special case exists, an example of which is described below, for which retention of some of the higher frequency components of the speech wave form is desirable. Under such circumstances, a low pass filter is employed for filter 16; however, its cutoff frequency is raised and the slope of its upper skirt is tailored to be more gradual. An example of a system in which this approach is employed is as a tactile aid for the deaf and the deaf/blind, an example of which is illustrated in FIG. 2.

Figure 2:
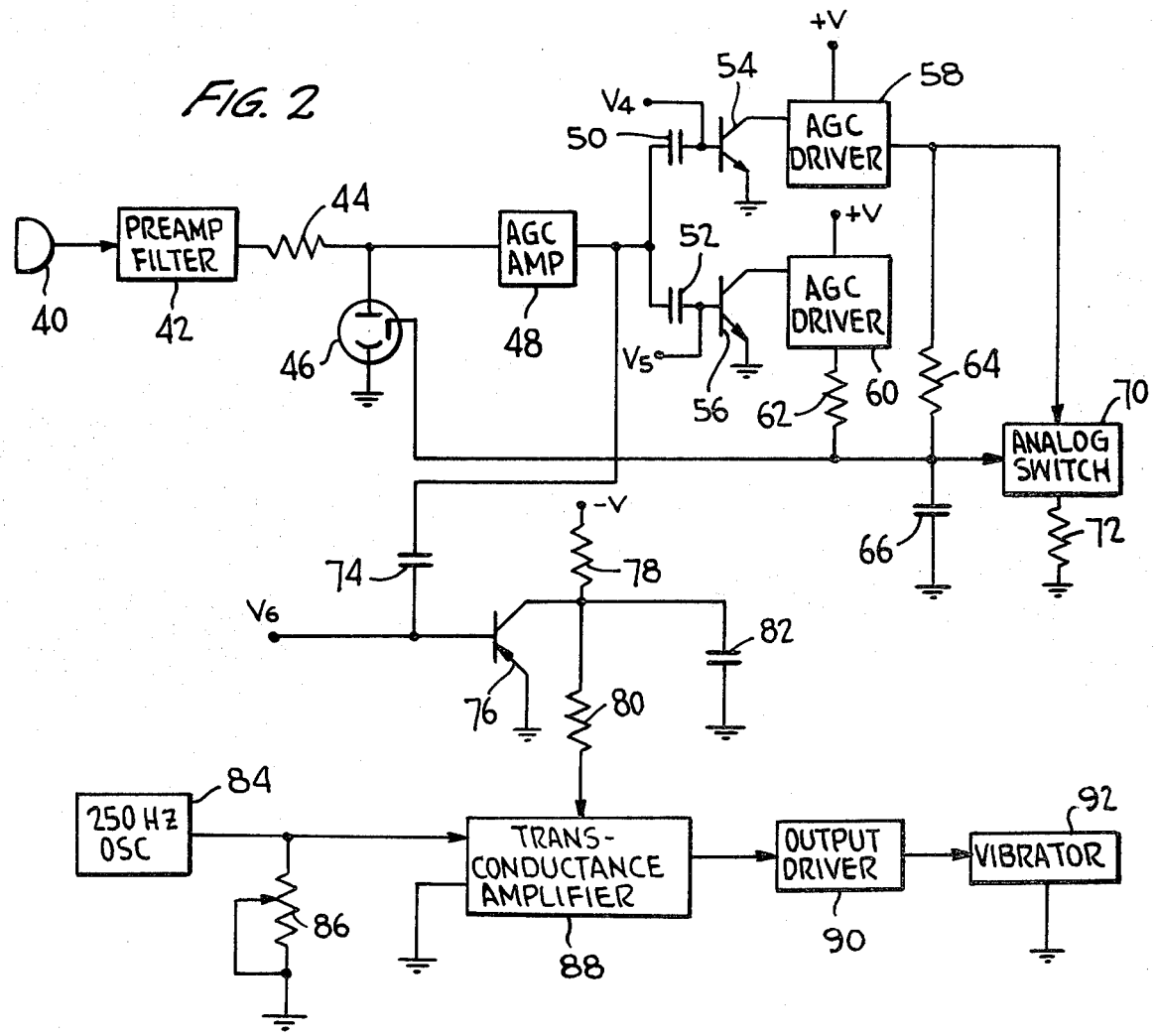
FIG. 2 is a schematic diagram of the system of FIG. 1 employed as part of a speech-responsive tactile vibrator system.

Referring specifically to FIG. 2, a microphone 40 provides a composite audio signal to a preamplifier and filter circuit 42. The composite audio signal takes the general form of that indicated for the input signal to amplifier 10 in FIG. 1. The output signal from the preamplifier and filter circuit 42 is passed through a resistor 44 to an AGC amplifier 48 having a fixed gain. Gain control is achieved by means of a shunt MOSFET 46, the gate electrode of which is controlled by an AGC voltage appearing across storage capacitor 66. Storage capacitor 66 is, in all significant respects, the equivalent of storage capacitor 26 in FIG. 1. The output signal from amplifier 48 is passed through a coupling capacitor 50 to the base of NPN transistor 54 which is biased by a bias voltage $V_4$. Transistor 54 is the detector transistor for the slow-attack, fast-release AGC loop and has its collector connected in driving relation with an AGC driver circuit 58. The emitter of transistor 54 is coupled to ground. The AGC driver circuit 58 provides charging current for capacitor 66 through resistor 64 which has a relatively high resistance. In addition, the output signal from AGC driver 58 controls analog switch 70 which, in all significant respects, functions in substantially the same manner as analog switch 34 of FIG. 1. A discharge resistor 72 for storage capacitor 66 is selectively connected to the storage capacitor by means of analog switch 70 under the control of the output signal from AGC driver circuit 58.

The output signal from AGC amplifier 48 is also applied through coupling capacitor 52 to the base of NPN detector transistor 56 of the fast-attack, slow-release AGC loop. A bias voltage $V_5$, which is always chosen to be greater than the bias voltage $V_4$, is employed to bias the base of transistor 56. The emitter of transistor 56 is coupled to ground and its collector drives an AGC driver circuit 60. A charging path from AGC driver circuit 60 for capacitor 66 is provided by resistor 62 having a relatively low resistance.

The output signal from AGC amplifier 48 is also passed through a coupling capacitor 74 to the base electrode of a PNP transistor 76, the emitter of which is grounded. A bias voltage $V_6$ is also connected to the base of transistor 76 and serves the same function as bias voltage $V_1$ of FIG. 1. The collector of transistor 76 is connected to the junction between resistors 78 and 80 connected in series between a negative supply voltage and a transconductance amplifier 88 which serves as the multiplier circuit for the system of FIG. 2. Filtering of the envelope-detected signal appearing at the collector of transistor 76 is effected by a filtering capacitor 82. Thus, as in the case with the circuit of FIG. 1, the envelope-detected and filtered output signal from the AGC amplifier is applied to a multiplier circuit which, in the case of the system of FIG. 2, takes the form of transconductance amplifier 88. The other input signal to transconductance amplifier 88 is derived from a 250 Hz oscillator 84 which provides a constant frequency 250 Hz tone. The level of this tone is controlled by a shunt potentiometer 86. Multiplication is effected in the transconductance amplifier 88, the signal from which is supplied to output driver circuit 90 and applied to a mechanical vibrator 92.

In operation, the system of FIG. 2 operates in substantially the same manner as the system of FIG. 1 with the exception that the second input signal to the multiplier circuit corresponds to the composite audio input signal in the system of FIG. 1 but is a constant 250 Hz tone in the system of FIG. 2. The purpose of such a system is to provide a tactile-sensible replica of speech envelopes and envelopes of other sounds which can be felt by deaf persons. The sensitivity of human skin to frequencies above approximately 400 Hz is relatively poor; supplying a 250 Hz carrier, therefore, which is modulated by the speech signal, makes it possible for a user to easily feel these waveforms which would not otherwise be capable of perception. Further, it should be noted that if the filler, comprising capacitor 82 and resistor 80, is permitted to pass higher frequency components, the 250 Hz signal retains additional information concerning the original signal, which information can be perceived as pertubations of the 250 Hz signal; this, of course, is advantageous to the user. The automatic noise suppression characteristics of the present invention are particularly important in a system of the type illustrated in FIG. 2 since, in the absence of the noise suppression, background noises tend to cause the output to vibrate continuously. Moreover, since such systems are employed by young children, it is important that the device not include any user-operated controls in order to attain perceivable speech-responsive vibrations. The present invention, as illustrated and described in reference to FIG. 1, is useful in conjunction with hearing aids. Typical applications in this regard are illustrated in FIGS. 3A, 3B and 3C. Specifically, a microphone 94 delivers a composite audio input signal to a preamplifier 96 which, in turn, delivers its input signal to the automatic background noise suppressor 98. The automatic background noise suppressor 98 corresponds to the system illustrated in FIG. 1. The output signal from the automatic background noise suppressor 98 may be used in a typical commercially available hearing aid system, such as the Rion Body Aid sold as Model HA-39AS with the automatic gain control circuit of that system removed and replaced by the automatic background noise suppressor 98. Such a system is illustrated by combining FIGS. 3A and 3B of the accompanying drawings such that the output signal from the automatic background noise suppressor 98 is applied to a volume control potentiometer 100 and from there to a tone control unit 102. The volume and tone controlled signals are then applied to a power amplifier 104 and from there to the earphone 106. Alternatively, the Rion Behind The Ear Model HB-39AS may employ the automatic background noise suppressor of the present invention. In the latter embodiment, which is obtained by combining FIGS. 3A and FIG. 3C of the accompanying drawings, the original commercial model does not include an integral automatic gain control circuit. In either case, the second input to the multiplier circuit 18 of FIG. 1 is provided from the output of the AGC amplifier 10. In this case, the hard-limiting type of automatic gain control is highly desirable since recruitment is often a concomitant problem for individuals with hearing loss. This results in a lowering of the pain threshold for hearing and, therefore, the characteristic of limiting the volume to a predetermined level is an important feature.

The system of FIG. 1 is also useful for intercomtypes of systems, such as the type illustrated in FIGS. 4A and 4B. The present invention is particularly useful for intercom systems where one or more of the stations is located in a noisy area. A microphone 118 delivers its composite audio input signal to preamplifier 120, thence through an automatic noise suppressor, 121, the output signal from which is transmitted in the usual manner to other stations. The receiving portion of the intercom system receives its signal transmitted from other stations and includes an automatic background noise suppressor 122 to process the received signal. The output signal from the automatic background noise suppressor is delivered to a power amplifier 124 which drives a speaker 126. FIGS. 4A and 4B show a typical application in which the automatic background noise suppressor of FIG. 1 can be used either in the transmitting side of the circuit, the receiving side of the circuit, or both. Since the automatic background noise suppressor of the present invention is self-contained, except for a power supply, it is possible to implement its function for intercom applications as an addition to existing systems. This is of considerable significance since, for many installations, not all of the various stations are located in noisy areas and it would, therefore, not be necessary to replace an entire system in order to obtain the advantages of the present invention.

The automatic background noise suppressor of the present invention is also useful as an automatic setting squelch circuit in applications for which conventional squelch systems are now employed. This includes: CB radio, radio-telephony in its various forms, and general speech communication systems employing electromagnetic energy transmission as the means for sending or receiving messages over a distance without wires. An example of a system of this type is illustrated in FIG. 5. As illustrated, an antenna 128 receives a radio frequency signal which is demodulated to provide an audio signal at RF and IF circuit 130. The audio signal is amplified in an audio preamplifier 132 and passed to the automatic background noise suppressor 134 of the present invention. The output signal from the automatic background noise suppressor is amplified by power amplifier 136 and delivered to a loud speaker.

In all of the embodiments described hereinabove, one of the signals applied to the output multiplier circuit (for example, multiplier circuit 18 of FIG. 1) requires the unique utilization of a slow-attack, fast-release AGC loop to establish a quiescent voltage in the presence of noise which can be delivered to a biased envelope detector so that only speech signals are provided at nonzero amplitude from the envelope detector. It is possible to derive this multiplicand signal in another manner, however, and a circuit for achieving this result is illustrated in FIG. 6 to which specific reference is now made. Specifically, the composite audio input signal is applied to a preamplifier 140 and delivered to an envelope detector 142. The output signal from envelope detector 142 is delivered to a band pass filter 144, the output signal from which is delivered to another envelope detector 146. The output signal from detector 146 is filtered at filter 148 and applied as the desired multiplicand signal to multiplier circuit 150. The other input signal to multiplier circuit 150 is the pre-amplified composite audio input signal. In this system, the continuous background noise, after detection at envelope detector 142, provides a d.c. voltage to band pass filter 144. The pass band for filter 144 is selected so that its lower cutoff frequency is somewhat above 0 Hz. In this manner, the d.c. signal provided by the envelope detector 142 in response to the quiescent noise is not passed by filter 144. The high cut-off frequency of the pass band of filter 144 is selected at approximately 50 Hz so that speech waveforms detected by envelope detector 142 are passed by filter 144. The non-zero output signal from filter 144 is detected again at detector 146, in a manner analogous to that set forth above for envelope detector 14 of FIG. 1. The output from detector 146 is filtered by a filter 148 which is analogous to filter 16. As a consequence, the output signal from filter 148 is a non-zero voltage only when speech components are present in the composite audio signal applied to and amplified by preamplifier 140.

It should be noted that, while the present invention performs somewhat the same function as that performed by a squelch system of a conventional type, the squelch system does not perform the functions which can be performed by the present invention. For example, a hiss due to poor carrier limiting in a radio receiver is eliminated from the audio output signal by means of the present invention because the circuit of the present invention operates on the audio signal per se. In addition, if the hiss is transmitted as a modulation on a carrier, the present invention eliminates that hiss from the audio output signal also. However, in a conventional squelch circuit, only the hiss due to poor carrier limiting is eliminated but the hiss transmitted as modulation on a carrier is not.

It must be expressly stated that the present invention is not suitable for use in transmitting or enhancing sustained signals, such as music. Such signals are either entirely eliminated or, at the very least, passed with reduced gain as compared to speech or speech-like signals. By way of example only, and not for purposes of limiting the scope of the present invention, the circuit components in the various embodiments described herein may take the parameter values set forth in this paragraph. In the system of FIG. 1, storage capacitor 26 may be 10 µf, resistor 24, may be 3 megohms, resistor 32 is 100 ohms and resistor 36 is 5 Kohms. In the system of FIG. 2, capacitor 66 is 10 µf, capacitor 82 is 0.5 µf, resistor 44 is 390 Kohms, resistor 62 is 100 ohms, resistor 64 is 3 megohms, resistor 72 is 10 Kohms, resistor 78 is 1.5 Kohms, and resistor 80 is 10 Kohms.

While I have described and illustrated specific embodiments of my invention, it will be clear that variations of the details of construction specifically illustrated and described may be resorted to without departing from the true spirit and scope of the invention defined in the appended claims.

What is claimed is:

1. An automatic signal enhancement system for processing an audio input signal containing unwanted sustained components and desired transient components and providing a system output signal which is present only when said desired transient components are present in said input signal, said system comprising:
   first means responsive to application of first and second signals thereto for providing said system output signal only when both said first and second signals are present and said first signal exceeds a predetermined amplitude level;
   second means connected to receive said input signal for providing a control signal at an amplitude above said predetermined amplitude level only when said desired transient components are present in said input signal;
   means for connecting said control signal to said first means as said first signal; and
   means for connecting said second signal to said first means;
   wherein said second signal is said audio input signal;
   wherein said second means comprises:
      automatic gain control means responsive to said input signal for providing a further signal at a pre-selected amplitude when only said unwanted sustained component and not said desired transient components are present in said input signal, and for providing said further signal at an amplitude which exceeds said pre-selected amplitude and as a function of the amplitude of said desired transient components when both said unwanted sustained components and desired transient components are present in said input signal;
      envelope detector means connected to receive said further signal for providing an envelope-detected version of said further signal only when said further signal amplitude exceeds said pre-established amplitude; and
      filter means connected to receive said detected signal and to provide said control signal;
   wherein said automatic gain control means comprises:
      variable gain amplifier means connected to receive said input signal and for providing said further signal; and
      slow-attack, fast-release gain control means responsive to the further signal for adjusting the gain of said variable gain amplifier means in response to said unwanted sustained components such that said further signal amplitude is maintained at said pre-selected amplitude.

2. The system according to claim 1 wherein said automatic gain control means further comprises:
   fast-attack, slow-release gain control means responsive to the further signal for adjusting the gain of said variable gain amplifier means to limit the amplitude of said desired transient components in said further signal.

3. The system according to claim 1 further comprising oscillator means for providing a constant frequency signal in the audio frequency range as said second signal.

4. The system according to claim 3 further comprising vibrator means responsive to said system output signal for providing tactile vibrations at said constant frequency whenever said system output signal is present.

5. An automatic signal enhancement system for processing an audio input signal containing unwanted sustained components and desired transient components and providing a system output signal which is present only when said desired transient components are present in said input signal, said system comprising:
   first means responsive to application of first and second signals thereto for providing said system output signal only when both said first and second signals are present and said first signal exceeds a predetermined amplitude level;
   second means connected to receive said input signal for providing a control signal at an amplitude above said predetermined amplitude level only when said desired transient components are present in said input signal;

means for connecting said control signal to said first means as said first signal; and means for connecting said second signal to said first means;

wherein said second signal is said audio input signal;

wherein said second means comprises:

automatic gain control means responsive to said input signal for providing a further signal at a preselected amplitude when only said unwanted sustained component and not said desired transient components are present in said input signal, and for providing said further signal at an amplitude which exceeds said pre-selected amplitude and as a function of the amplitude of said desired transient components when both said unwanted sustained components and desired transient components are present in said input signal;

envelope detector means connected to receive said further signal for providing an envelope-detected version of said further signal only when said further signal amplitude exceeds said pre-established amplitude; and filter means connected to receive said detected signal and to provide said control signal;

wherein said automatic gain control means comprises:

variable gain amplifier means connected to receive said input signal and to provide said further signal;

storage capacitor means;

a first charging circuit connected to receive said further signal and including a relatively low-resistance charge path connected to pass charging current from said further signal to said storage capacitor means;

a second charging circuit connected to receive said further signal and including a relatively high-resistance charge path connected to pass charging current from said further signal to said storage capacitor means;

a resistive discharge path;

switching means responsive to charging current being passed through said second charging circuit for discharging charge above a predetermined charge level from said capacitor through said resistive discharge path; and means for varying the gain of said variable gain amplifier means as a function of the charge stored in said storage capacitor means.

6. An automatic signal enhancement system for processing an audio input signal containing unwanted sustained components and desired transient components and providing a system output signal which is present only when said desired transient components are present in said input signal, said system comprising:

first means responsive to application of first and second signals thereto for providing said system output signal only when both said first and second signals are present and said first signal exceeds a predetermined amplitude level;

second means connected to receive said input signal for providing a control signal at an amplitude above said predetermined amplitude level only when said desired transient components are present in said input signal;

means for connecting said control signal to said first means as said first signal; and means for connecting said second signal to said first means;

wherein said second signal is said audio input signal;

wherein said desired transient components are speech components, or components having the temporal properties of speech, and wherein said unwanted sustained components are continuous background noise components of substantially constant amplitude in the audio frequency range, said system being further characterized in that said first means is a signal multiplier circuit which provides said system output signal at an amplitude which is the product of the amplitudes of said input and control signals;

wherein said second means comprises:

first envelope detector means for detecting the envelope of said audio input signal;

band pass filter means for filtering the detected input signal envelope, said band pass filter means having a low frequency cut-off above 0 Hz and high frequency cut-off above 50 Hz;

second envelope detector means connected to receive signal passed by said band pass filter means; and further filter means connected to receive detected signal from said second envelope detector means to provide said control signal.

7. An automatic signal enhancement system for processing an audio input signal containing desired transient speech-like components residing in a characteristic frequency range and unwanted sustained noise components residing both inside and outside said characteristic frequency range, and providing a system output signal which is present only when said desired transient speech-like components are present in said audio input signal, whether or not said unwanted sustained noise components are present, said system comprising:

signal multiplier means responsive to first and second signals applied thereto for providing said system output signal at an amplitude which corresponds to the amplitude of said second signal multiplied by the amplitude of said first signal;

control means responsive to said audio input signal for providing said first signal: (a) at zero amplitude when the desired transient speech-like components are absent from said audio input signal; and (b) at an amplitude which varies as a proportional function of the amplitude of said audio input signal only when said desired transient speech-like components are present in said audio input signal, irrespective of the presence of said unwanted sustained noise components in said audio input signal;

means for applying said first signal from said control means to said signal multiplier means; and further means for applying said second signal to signal multiplier means.

8. The system according to claim 7 further comprising:

volume control means for adjusting the amplitude of said system output signal; and earphone means for receiving said system output signal and converting it to audible sound.

9. The system according to claim 7 further comprising a plurality of transducer stations connected to receive said system output signal and convert it to audible sound.

10. The system according to claim 7 wherein said further means comprises means for connecting said audio input signal to said signal multiplier means as said second signal.

11. The system according to claim 10 wherein said desired transient components are speech components, or components having the temporal properties of speech, and wherein said unwanted sustained components are continuous background noise components of substantially constant amplitude in the audio frequency range, said system being further characterized in that said control means comprises:
   automatic gain control means responsive to said audio input signal for providing a further signal at a pre-selected amplitude when only said unwanted sustained component and not said desired transient components are present in said audio input signal, and for providing said further signal at a variable amplitude which exceeds said pre-selected amplitude and as a function of the amplitude of said desired transient components when said desired transient components are present alone and when said unwanted sustained components and desired transient components are both present in said audio input signal; and
   signal shaper means connected to receive said further signal for providing said control signal at said proportionally varying amplitude only when said further signal amplitude exceeds said pre-established amplitude;
   and wherein said automatic gain control means comprises:
   variable gain amplifier means connected to receive said audio input signal and to provide said further signal;
   storage capacitor means;
   a first charging circuit connected to receive said further signal and including a relatively low-resistance charge path connected to pass charging current from said further signal to said storage capacitor means;
   a second charging circuit connected to receive said further signal and including a relatively high-resistance charge path connected to pass charging current from said further signal to said storage capacitor means;
   a resistive discharge path;
   switching means responsive to charging current being passed through said second charging circuit for discharging charge above a predetermined charge level from said capacitor through said resistive discharge path; and
   means for varying the gain of said variable gain amplifier means as a function of the charge stored in said storage capacitor means.

12. The system according to claim 10 wherein said desired transient components are speech components, or components having the temporal properties of speech, and wherein said unwanted sustained components are continuous background noise components of substantially constant amplitude in the audio frequency range, said system being further characterized in that said control means comprises:
   automatic gain control means responsive to said audio input signal for providing a further signal at a pre-selected amplitude when only said unwanted sustained components and not said desired transient components are present in said audio input signal, and for providing said further signal at a variable amplitude which exceeds said pre-selected amplitude and as a function of the amplitude of said desired transient components when said desired transient components are present alone and when said unwanted sustained components and desired transient components are both present in said audio input signal;
   signal shaping means connected to receive said further signal for providing said control signal at said proportionally varying amplitude only when said further signal amplitude exceeds said pre-established amplitude; and
   wherein said automatic gain control means comprises:
   variable gain amplifier means, connected to receive said input signal, for providing said further signal; and slow-attack, fast-release gain control means responsive to said further signal for adjusting the gain of said variable gain amplifier means in response to said unwanted sustained components such that said further signal amplitude is maintained at said pre-selected amplitude.

13. The system according to claim 12 wherein said automatic gain control means further comprises:
   fast-attack, slow-release gain control means responsive to said further signal for adjusting the gain of said variable gain amplifier means to limit the amplitude of said desired transient components in said further signal.

14. The system according to claim 7 wherein said further means comprises oscillator means for supplying a constant amplitude audio frequency signal as said second signal.

15. The system according to claim 14 further comprising vibrator means responsive to said system output signal for providing tactile vibrations at the frequency of said constant amplitude audio frequency signal and at an amplitude which is a function of the amplitude of the system output signal.

16. An automatic gain control system responsive to an applied input signal for providing a gain controlled signal at a pre-selected amplitude when only unwanted sustained components and not desired transient components are present in said applied input signal, and for providing said gain controlled signal at an amplitude which exceeds said pre-selected amplitude and which varies over a continuous range as a function of the amplitude of said desired transient components when both said unwanted sustained components and desired transient components are present in said applied input signal, said automatic gain control system comprising:
   variable gain amplifier means connected to receive said input signal for providing said gain controlled signal; and
   slow-attack, fast-release gain control means responsive to the gain controlled signal for adjusting the gain of said variable gain amplifier means in response to said unwanted sustained components such that said gain controlled signal amplitude is maintained at said pre-selected amplitude.

17. The system according to claim 16 wherein said automatic gain control means further comprises:
   fast-attack, slow-release gain control means responsive to the gain controlled signal for adjusting the gain of said variable gain amplifier means to limit the amplitude of said desired transient components in said gain controlled signal.

18. An automatic gain control system responsive to an applied input signal for providing a gain controlled signal at a pre-selected amplitude when only unwanted sustained component and not desired transient components are present in said input signal, and for providing said gain controlled signal at an amplitude which exceeds said pre-selected amplitude and which varies over a continuous range as a function of the amplitude of said desired transient components when both said unwanted sustained components and desired transient components are present in said input signal, said automatic gain control system comprising:

variable gain amplifier means connected to receive said input signal and to provide said gain controlled signal;

storage capacitor means;

a first charging circuit connected to receive said gain controlled signal and including a relatively low-resistance charge path connected to pass charging current from said gain controlled signal to said storage capacitor means;

a second charging circuit connected to receive said gain controlled signal and including a relatively high-resistance charge path connected to pass charging current from said gain controlled signal to said storage capacitor means;

a resistive discharge path;

switching means responsive to charging current being passed through said second charging circuit for discharging charge above a predetermined charge level from said capacitor through said resistive discharge path; and means for varying the gain of said variable gain amplifier means as a function of the charge stored in said storage capacitor means.

19. An automatic signal enhancement system for processing an audio input signal containing desired transient speech-like components and unwanted sustained noise components, and providing a system output signal which is enhanced in amplitude only when said desired transient speech-like components are present in said input signal, irrespective of the presence and absence of said unwanted sustained noise components in said input signal, said system comprising:

adjustable gain amplifier means, connected to receive said audio input signal, for providing a gain controlled signal;

slow-attack, fast-release control circuit means responsive to said gain controlled signal for automatically adjusting the gain of said amplifier means to provide said gain controlled signal at a known constant amplitude in response to the presence of only said sustained noise components without said transient speech-like components in said gain controlled signal, regardless of the amplitude level of said sustained noise components in said audio input signal;

biased detector means, connected to receive said gain controlled signal, for providing a further signal at: sustantially zero amplitude when the amplitude of said gain controlled signal is said known constant amplitude; and at an amplitude which is a function of the amplitude of said audio input signal when the amplitude of said gain controlled signal exceeds said known constant amplitude;

filter means connected to receive said further signal and provide a processed signal as a predetermined function of the further signal; and signal multiplier means, connected to receive said processed signal and a second signal, for providing said output signal with an amplitude corresponding to the product of the amplitudes of said processed and second signals.

20. The system according to claim 19 further comprising fast-attack, slow-release control circuit means responsive to the gain controlled signal for automatically adjusting the gain of said gain control means to limit the amplitude of said desired transient speech-like components in said again controlled signal.

21. An automatic method of processing an audio input signal containing desired transient speech-like components residing in a characteristic frequency range and unwanted sustained noise components residing both inside and outside said characteristic frequency range, and providing a system output signal which is present only when said desired transient speech-like components are present in said audio input signal, whether or not said unwanted sustained noise components are present, said method comprising the steps of:

multiplying first and second signals to provide said system output signal at an amplitude which corresponds to the amplitude of said second signal multiplied by the amplitude of said first signal; and in response to said audio input signal, providing said first signal: (a) at zero amplitude when the desired transient speech-like components are absent from said audio input signal; and (b) at an amplitude which varies as a proportional function of the amplitude of said audio input signal only when said desired transient speech-like components are present in said audio input signal, irrespective of the presence of said unwanted sustained noise components in said audio input signal.

* * * * *